United States Patent
Ponganis et al.

(10) Patent No.: US 9,979,436 B2
(45) Date of Patent: May 22, 2018

(54) AUTOMATIC GAIN CONTROL OVER COPPER PAIRS USING DAISY-CHAINED AMPLIFIERS

(71) Applicants: Positron Access Solutions Corporation, Montreal (CA); DMS Enterprises, Inc., Geneva, IL (US)

(72) Inventors: Edward P. Ponganis, Modesto, CA (US); Daryl Scheans, Glendale, AZ (US); Sylvain St-Jacques, Deux-Montagnes (CA)

(73) Assignee: Positron Access Solutions Corporation, Montreal, Quebec ( * ) Notice: Subject to any disclaimer, the term of this patent is extended or adjusted under 35 U.S.C. 154(b) by 0 days. days.

(21) Appl. No.: 15/234,764

(22) Filed: Aug. 11, 2016

(65) Prior Publication Data

US 2018/0048351 A1  Feb. 15, 2018

(51) Int. Cl.
  *H04B 3/04* (2006.01)
  *H04L 12/28* (2006.01)
  *H03G 3/30* (2006.01)
  *H04L 12/64* (2006.01)

(52) U.S. Cl.
  CPC .......... *H04B 3/04* (2013.01); *H03G 3/3036* (2013.01); *H04L 12/2883* (2013.01); *H04L 12/2898* (2013.01); *H04L 2012/6478* (2013.01)

(58) Field of Classification Search
  CPC ... H04L 27/0002; H04M 11/06; H04M 1/738; H04M 11/062
  See application file for complete search history.

(56) References Cited

U.S. PATENT DOCUMENTS

| | | | |
|---|---|---|---|
| 6,226,322 B1 * | 5/2001 | Mukherjee | H04B 3/145 333/28 R |
| 7,110,528 B2 | 9/2006 | Larzabal et al. | |
| 7,174,488 B1 * | 2/2007 | Chu | H04M 3/085 714/712 |
| 7,366,286 B1 * | 4/2008 | Shenoi | H04M 11/062 379/93.01 |
| 7,587,042 B2 * | 9/2009 | Larzabal | H04B 3/36 379/340 |
| 7,706,526 B2 | 4/2010 | Ponganis et al. | |
| 9,191,496 B1 * | 11/2015 | Barrett | H04M 3/085 |
| 2002/0032004 A1 * | 3/2002 | Widrow | H04B 3/36 455/22 |

(Continued)

*Primary Examiner* — Ross Varndell
(74) *Attorney, Agent, or Firm* — David H. Judson

(57) ABSTRACT

An apparatus and method to automatically adjust a gain of an analog signal adapted to be transmitted over a twisted pair of telephone lines between a first end (e.g., a DSLAM), and a second end (e.g., a modem), is described. The apparatus comprises an amplifier, and a control mechanism. The amplifier receives the analog signal from a respective first or second end, and transmits the received analog signal in the respective downstream or upstream direction. The control mechanism, which preferably is operative only during a train or re-train mode, senses whether the analog signal is within a specified amplitude range associated with a receiver at the respective second end or first end, and, responsive to a determination that the analog signal is not within the specified amplitude range, determines and generates a control signal. The control signal is operative to adjust a gain of the amplifier to a determined value.

13 Claims, 6 Drawing Sheets

(56) References Cited

U.S. PATENT DOCUMENTS

| | | | | |
|---|---|---|---|---|
| 2008/0080595 A1* | 4/2008 | Wang | ..................... | H04B 3/36 375/211 |
| 2011/0211623 A1* | 9/2011 | Kanellakopoulos | ..... | H04B 3/32 375/222 |
| 2012/0287968 A1* | 11/2012 | Gainey | .............. | H04B 7/15585 375/211 |

* cited by examiner

AUTOMATIC GAIN CONTROL OVER COPPER PAIRS USING DAISY-CHAINED AMPLIFIERS

BACKGROUND

Technical Field

This disclosure relates generally to automatic gain control of an analog signal over copper pairs.

Background of the Related Art

The demand for higher frequency transmission of digital and analog data over copper wire continues to increase. Indeed, not only are frequencies increasing, but also the required distance of transmission is increasing as well. Higher frequencies and longer distances create a significant problem for operational amplifier (OPAMP) circuitry designed to receive the data signal at both ends of the copper loop. Physics dictates that signal strength attenuates exponentially with distance. A distance increase of only a few hundred feet can prevent electronic circuitry from working correctly, but product specifications typically require functionality across wide distance variations. An example of this is DSL over copper twisted pairs.

Further, analog signal strength may vary with physical loop conditions such as time, temperature, vibration or moisture. The strength of output of analog sensors, for example, medical sensors, may deteriorate as environmental conditions change; this causes operational amplifier circuits to process signals incorrectly or to constantly self-calibrate.

Ultimately, OPAMP circuitry often has to work with received (input) signals with very wide amplitude and frequency ranges. Very often, there is only very limited power available for the circuit, and the OPAMP needs to also account for transient power surges that will cause noise or data errors. In addition, battery backup or battery-powered circuitry is required in many applications with the above characteristics, but is not always feasible or acceptable due to power requirements.

Under the above conditions, OPAMP circuitry often needs to undergo extensive manual calibration to achieve optimal efficiency. This is not always possible in many situations, such as when the equipment is remotely deployed, when physical access is difficult or impossible, or when it is too costly to get access to the remote equipment or location.

The most widely used solutions in the marketplace today rely on manual calibration or signal processing with the help of a microprocessor or a digital signal processor (DSP). Manual calibration is used and useful where there are limited numbers of variables, adequate physical space on circuit board for jumpers or switches, easy access, low labor cost, stable environment, and documented gain or calibration settings. Unfortunately, this is not the case in many applications, which prevents the use of a manual calibration approach. The more widely-accepted solution is to use digital signal processing (DSP) to compensate for analog signal attenuation and distortion. The DSP-based approach requires converting the analog signal into a digital signal for processing. The standard method is to use an analog-to-digital (A/D) converter with the required number of bits, accuracy, resolution, conversion rate, and cost. Once converted, the digital data also must be processed to calculate the desired action. In many cases, the processing of the data is dependent on the classification of analog signal sent. For example, the processing of an ADSL signal is different than a VDSL2 signal. In addition to the complexity and limitations of signal processing, solutions of this type require significant power and create high current spikes or analog noise.

There remains a need to provide an operational amplifier circuit design that can self-calibrate itself based on a wide range of analog signals in an environment where available power is very limited.

BRIEF SUMMARY

A technique of this disclosure automatically adjusts a gain of an analog signal adapted to be transmitted over a twisted pair of telephone lines between a first end, and a second end. Typically, the first end is a DSLAM associated with a central office, and the second end is a modem associated with customer premises equipment (CPE). Signaling between the first end and the second end is in a downstream direction, and signaling between the second end and the first end is in an upstream direction. Preferably, the apparatus comprises an amplifier, and a control mechanism. The amplifier receives the analog signal from a respective first or second end, and transmits the received analog signal in the respective downstream or upstream direction, as the case may be. The control mechanism, which preferably is operative only during a train or re-train mode, senses whether the analog signal is within a specified amplitude range associated with a receiver at the respective second end or first end, and, responsive to a determination that the analog signal is not within the specified amplitude range, determines and generates a control signal. The control signal is operative to adjust a gain of the amplifier to a determined value. Preferably, the control mechanism is further operative to maintain the gain of the amplifier substantially at the determined value after the train or re-train mode terminates and the apparatus is operating in a data transfer mode. The gain of the amplifier is maintained substantially at the determined value until initiation of a next train or re-train mode.

In another embodiment, a pair of apparatus (such as described above) are daisy-chained. The arrangement enables a method of adjusting a gain of an analog signal adapted to be transmitted over a twisted pair of telephone lines between a first end, and a second end, wherein signaling between the first end and the second end is in a downstream direction, and wherein signaling between the second end and the first end is in an upstream direction. In this arrangement, and respect to signaling in the downward direction, a first apparatus is located at a first location along an analog signal path. During a train mode of a connection establishment between the first and second ends, an amount and type of gain adjustment to be applied to the analog signal at the first location are determined, and then applied at the first location. A second apparatus is located at a second location along the analog signal path, the second location being one that is closer to the second end than is the first location. During the train mode, an amount and type of gain adjustment to be applied to the analog signal at the second location are determined. The determination at the second location, however, is not initiated until the gain adjustment is first determined and applied at the first location.

The foregoing has outlined some of the more pertinent features of the subject matter. These features should be construed to be merely illustrative.

BRIEF DESCRIPTION OF THE DRAWINGS

For a more complete understanding of the disclosed subject matter and the advantages thereof, reference is now made to the following descriptions taken in conjunction with the accompanying drawings, in which.

DETAILED DESCRIPTION OF AN ILLUSTRATIVE EMBODIMENT

This disclosure provides processes, apparatus and methods that are particularly well-adapted for self-calibration of analog signals of significant amplitude and frequency variations over copper pairs, even where an available power budget is extremely tight or limited.

Figure 1:
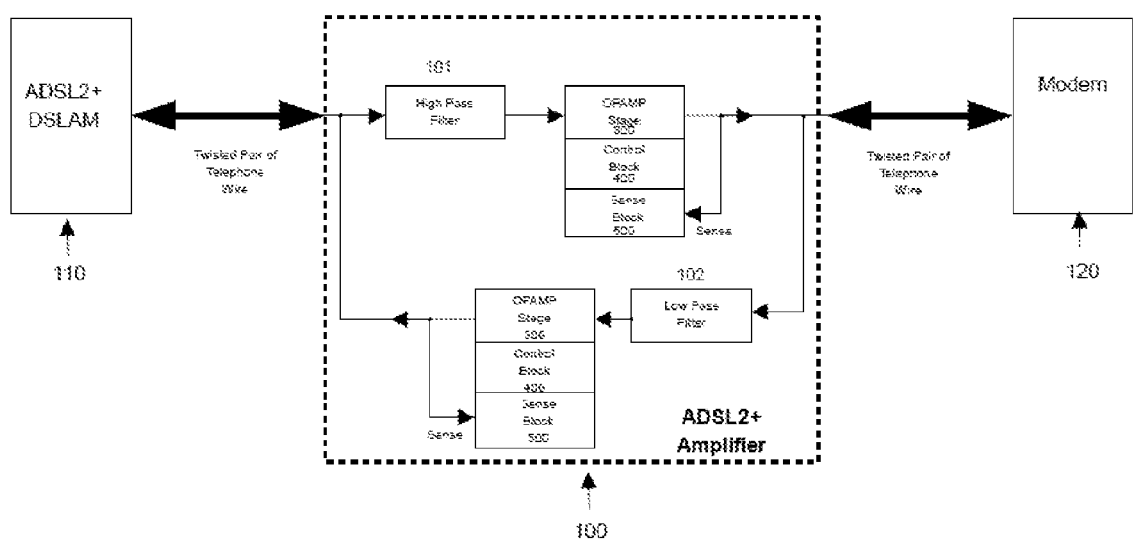
FIG. 1 depicts a first embodiment of the gain control mechanism of this disclosure being used as part of an ADSL2+ amplifier.

FIG. 1 illustrates an ADSL2+/VDSL2 amplification apparatus 100 of this disclosure installed between a DSLAM 110 and a remote modem 120 to compensate for line attenuation over a copper pair between the DSLAM 110 and the remote modem 120. Preferably, the amplification apparatus 100 incorporates a high pass filter 101 in the downstream direction (toward modem 120), with a gain amplification circuit made up of an OPAMP stage block 300, a control block 400 and a sense block 500. While the blocks 300, 400 and 500 are shown as discrete, this is not a requirement. In the upstream direction (toward the DSLAM 110), the technique of this disclosure (as will be described) is used by the ADSL2+/VDSL2 amplification apparatus 100 and incorporates a low pass filter 102 in the upstream direction (toward DSLAM 110), once again with a gain amplification circuit made up of OPAMP stage block 300, control block 400 and sense block 500.

Figure 2:
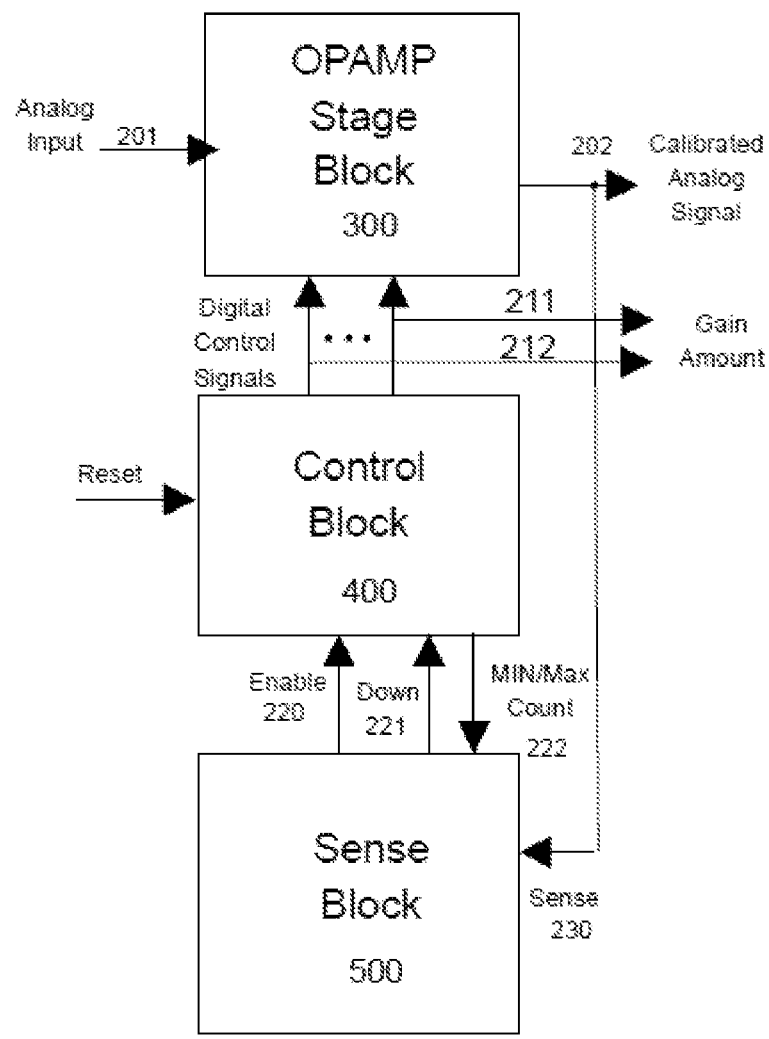
FIG. 2 is a block diagram of the gain control mechanism that shows various functional blocks (OPAMP, control and sensor) that comprise the mechanism, together with various interface signals among these components.

FIG. 2 is a block diagram of the first embodiment of gain control mechanism. In many cases, an analog signal 201 is generated that represents the conversion of the physical world into an electronic medium. For example, the analog signal may represent one of the following: temperature, pressure, light, sound, data, heart rate, etc. The analog signals (whatever they may represent) are then converted to digital signals via A/D converters and signal processing. Typically, the analog signals are adapted to be directly connected to receiving electronic circuitry requiring the sending and receiving electronics to have compatible specifications. This requirement may add significant cost and power to the equipment. For example, an A/D converter may require more bits of accuracy, higher operating voltage, or a higher conversion rate. As will be seen, the technique of this disclosure reduces these dependencies by self-calibrating the analog signal to meet the design requirements of the receiver circuitry with minimal additional power consumption.

As noted above, there are three main functional blocks (OPAMP stage 300, control block 400, and sense block 500) that are now described.

The OPAMP Stage block 300 amplifies or attenuates the analog signal 201 to be conditioned. Preferably, the analog signal to be self-calibrated is routed to the OPAMP stage block 300 where an OPAMP with variable gain calibrates the signal to a specified amplitude. The amount of gain or attenuation is controlled by digital signals from the control block 400. The calibrated analog signal 202 output of the OPAMP stage block 300 is routed to the sense block 500 to provide feedback. Typically, the amount of power consumed by this functional block is dependent on the selected OPAMP component, from micro-watts to a few milliwatts, and it is part of the total system power. In addition to the calibrated analog signal, gain control signals 211 and 212 may be routed from gain control mechanism of this disclosure to the receiver circuitry to indicate how the analog signal 201 has been modified. This enables the receiver circuitry to reconstruct the analog signal 201 if necessary.

The control block 400 generates the digital signals 211 and 212 that determine the amount of attenuation or gain in the OPAMP stage 300. The control block 400 consumes power only when the OPAMP 300 is being calibrated. The amount of power consumed during calibration is in the order of a few milliwatts. As depicted, preferably the control block 400 has two control inputs (enable 220 and down 221) that determine the digital control signals (gain 211 and amount 212) supplied to the OPAMP block 300.

Sense block 500 determines whether the calibrated analog signal output 202 of the OPAMP stage 300 is within a specified amplitude range. In particular, sense block 500 determines whether the gain 211 needs to be increased or decreased. Typically, sense block 500 consumes less than a milliwatt, and the total power drawn is determined by two resistor ladders.

Figure 3:
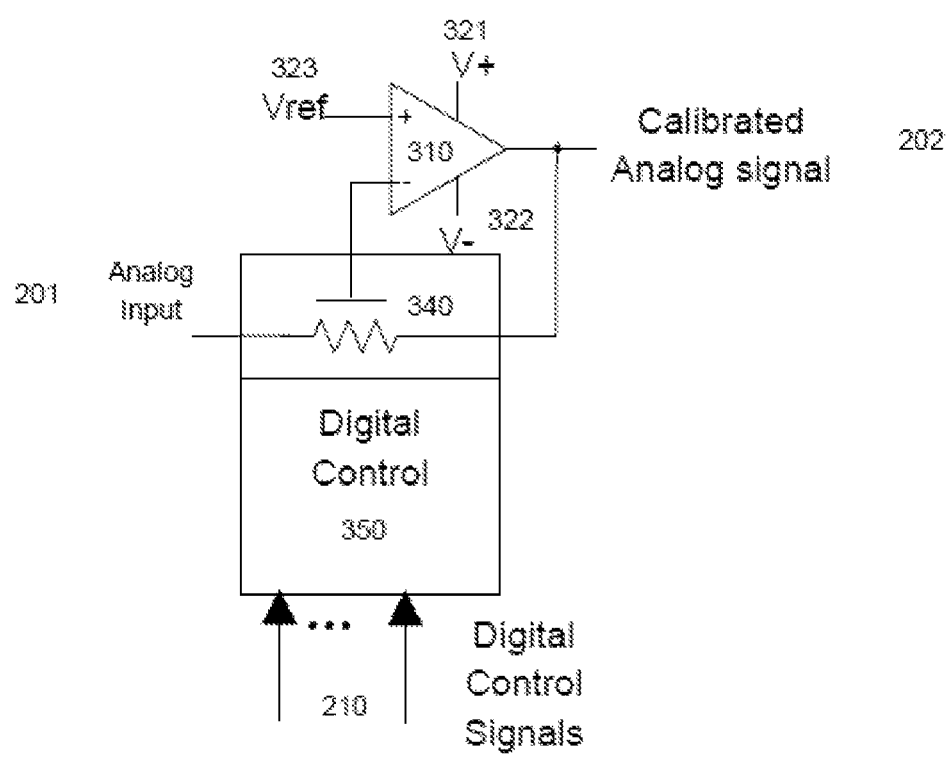
FIG. 3 depicts a representative OPAMP variable gain configuration of the gain control mechanism of this disclosure.

FIG. 3 is an example of typical OPAMP gain stage. The OPAMP 310 is powered by V+ 321 and V− 322 and in this embodiment, V+ 321 is set to 5.0V and V− 322 is set to 0V. The positive input Vref 323 of the OPAMP 310 is at a DC level of 50% of V+ 321 for an inverting amplifier application. The analog input signal 201 can be significantly higher than V+ 321, which would require attenuation, or can be significantly lower than Vref 323, which would require gain. The variable resistor 340 used in this embodiment is a TPL8002, which has six parallel inputs controlling a 64-bit resistor array. The digital inputs are between V+ 321 and Vref 323. The OPAMP 310 device selection preferably is based on frequency, power, drive, and voltage requirements of the application.

Figure 4:
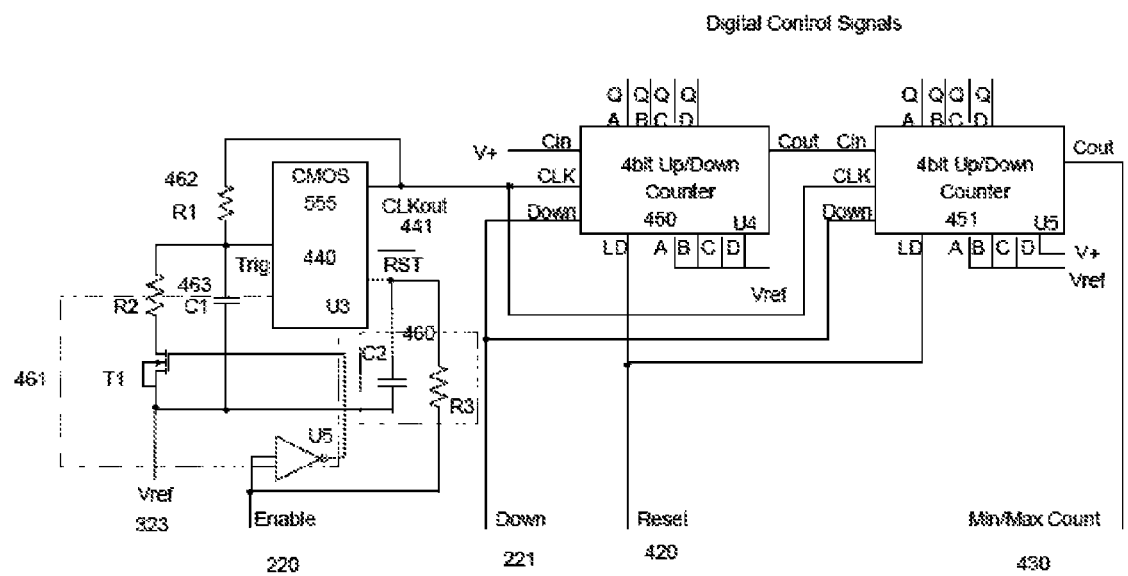
FIG. 4 depicts an implementation of representative control circuitry that interfaces to an OPAMP gain potentiometer.

FIG. 4 illustrates an embodiment of the control block 400. This approach uses a standard CMOS 555 Timer 440 such as an ICM7555, to generate a clock 441 for two cascaded CMOS up-down 4 bit counters 450 and 451. Preferably, the timer 440 only operates during the period of time that the OPAMP stage block 300 is being calibrated; therefore, there is no power consumed and no surge currents that can generate analog noise once the analog signal gain 202 has been calibrated. The counters 450 and 451 can be set to generate unity gain 212 with the OPAMP 310 during reset 420 if required. When the counters 450 and 451 reach a maximum count when counting up or reach zero when counting down, a max/min count signal 430 is high and signals the sense block 500 to stop the timer 450 and 451. The timer 450 and 451 is controlled by the enable 220 and down 221 inputs, which are controlled from the sense block 500. The purpose of R3 C2 filter 460 and R2, T1, U5 461 is to prevent glitches on the enable 220 input of the control block 400 from generating glitches on the CLK out pin 441. R1 462 and C1 463 set the clock frequency, which is determined by the characteristics of the analog signal 201.

Figure 5:
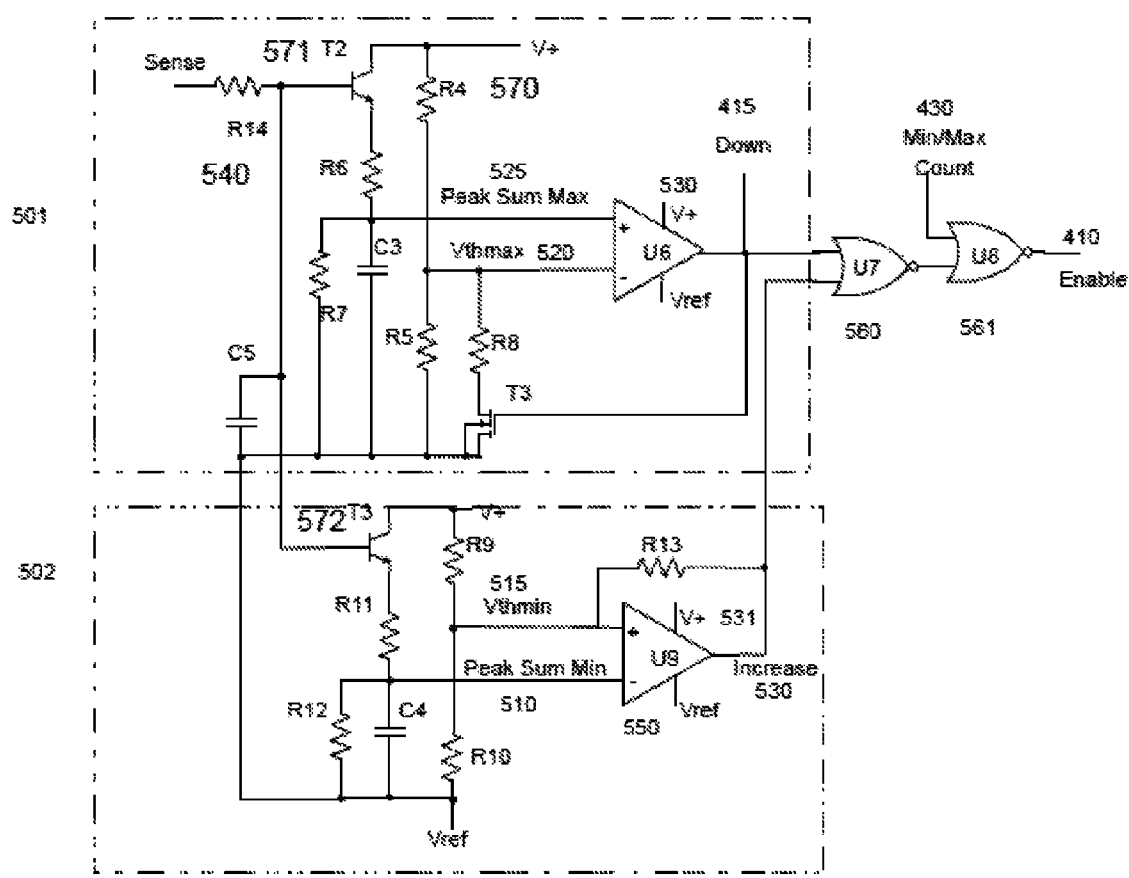
FIG. 5 depicts an implementation of a sensor circuitry that is operative to start and stop the control circuitry.

FIG. 5 illustrates an embodiment of the sense block 500. Preferably, there are two sub-blocks 501 and 502, with sub-block 502 operative to determine whether the calibrated analog signal 202 is below a minimum reference voltage Vthmin 515, and the other sub-block 501 operative to determine whether the calibrated analog signal 202 is above a reference voltage Vthmax 520. In addition, preferably both blocks 501 and 502 independently generate a "peak sum" voltage node 510 and 525 of the calibrated analog signal 202 to compare the reference voltages 515 and 520 against. Preferably, the "peak sum" level 525 is determined by T2, R6 and C3, and the "peak sum" 510 is determined by T3, R11 and C4. The NPN transistors, T2 571 and T3 572 isolate the "peak sum' nodes 525 and 510 from the calibrated analog signal 202 and charge the "peak sum" nodes 525 and 525 to a diode drop, T2 571 and T3 572, from the calibrated analog signal 202 peak. The resister R6 (R11) also limits the surge current through T2 (T3) when charging the storage capacitor C3 (C4).

Preferably, in this embodiment there is a low pass filter 540 implemented by R14 and C5 between the calibrated analog signal 202 and the NPN transistors, T2 571 and T3 572. This filter enables a circuit to be designed to respond to a required low frequency range, e.g., the capability to ignore high frequency crosstalk noise. A high pass filter could be used instead of a low pass filter to respond only to a high frequency signal. The discharge time of the "peak sum" node 510 is controlled by R12 and C4, and the discharge of "peak sum" node 525 is controlled by R7 and C3; this enables the circuit to ignore gaps (if any) in the calibrated analog signal 202. An example would be the gap between a handshake signal and data transmission. By using "peak sum" nodes 510 and 525, the only current consumed is the discharge current through R7 and R12, which current can be in the microampere range.

As further depicted, the "peak sum" nodes 510 and 525 voltage is compared to the reference voltage 515 and 520 with a nanopower comparator 530 and 531, such as TLV3492. The reference voltage Vthmin 515 used by the sub block 502 that determines whether the "peak sum" voltage PeakSumMin 510 is below a specified minimum reference voltage Vthmin 515, which is set by the following equation:

PeakSumMin=$R10 \times (V+/(((R9 \times R13)/(R9+R13))+R10))$.

Preferably, the circuit has hysteresis to prevent glitches, and the reference voltage is reduced when the comparator 550 U9 output, Increase 530, is low. The equation for the lower reference voltage Vthmin 515 is as follows:

$V\!th$min=$((R10 \times R13)/(R10+R13)) \times (V+/(R9+((R10 \times R13)/(R10+R13))))$.

Therefore, the signal Increase 530 is high (active) when the "peak sum" PeakSumMin 510 voltage is below the Vthmin 515 reference voltage, and it will remain high (active) until the "peak sum" voltages increases above a reduced reference voltage Vthmin 515.

The same is true for the sub block 501 that determines whether the "peak sum" PeakSumMax 525 voltage is above a specified maximum reference voltage Vthmax 520. The PeakSumMax 525 is set by the following equation:

PeakSumMax=$R5 \times (V+/(R4+R5))$.

As before, the circuit also has hysteresis to prevent glitches, and the reference voltage PeakSumMax 525 is reduced when the comparator U6 551 output Down 415 is high. The equation for the lower reference voltage PeakSumMax 525 is as follows:

PeakSumMax=$((R5 \times R8)/(R5+R8)) \times (V+/(R4+((R5 \times R8)/(R5+R8))))$.

Therefore, the control signal down 415 is low until the PeakSumMax 525 voltage is above the Vthmax 520 reference voltage, and it will remain high until the PeakSumMax 525 voltage drops below a reduced reference voltage Vthmax 520.

Sense block 500 preferably has two outputs, down 415 and enable 410. The down 415 output is low when the OPAMP 310 gain needs to be increased, and it is high when it should be decreased. The enable 410 output is high when the OPAMP 310 gain needs to be increased or decreased, and it is low when the OPAMP 310 is calibrated. This is the function of U7 560 and U8 561. The only measurable current consumed in this block is the current through R4 570 and R9 571.

The capabilities of the sense 500 and control blocks 400 enable the designer to set the response rate of the circuit, calibration rate, and OPAMP 310 output range. For example, and looking at FIG. 6, the analog output signals from an ADSL2+ DSLAM 110 and modem 120 on a copper pair have amplitudes, frequencies, and quiet periods as part of the exchange of information during the synchronization phase used to establish the link between the DSLAM 100 and the remote modem 120. The mechanism enables a designer to select response and calibration rates to compensate for timing variations, and to adjust the OPAMP 310 gains to complete the synchronization process for the establishment of the link.

Figure 6:
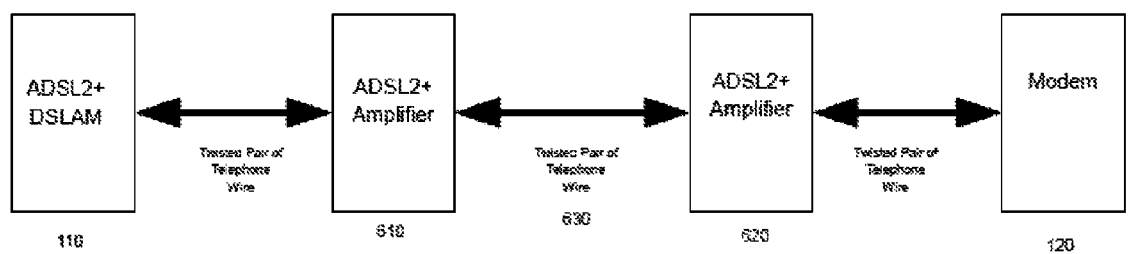
FIG. 6 depicts an alternative operating environment in which two gain control mechanisms of this disclosure are daisy-chained.

In situations where a copper loop 630 is very long or when the amplified signal from a first amplification apparatus 610 is not sufficient to generate acceptable performance; in such case, a second amplification apparatus 620 is cascaded or daisy-chained with the first amplification apparatus 610 by selecting different response or calibration rates. This daisy chain approach is depicted in FIG. 6. It prevents the changes made to the analog signal by the first amplification apparatus 610 from causing invalid changes to the analog signals 201 entering the second apparatus 620, which would then cause unsuccessful link synchronization between the DSLAM 110 and the modem 120.

The technique described herein provides significant advantages. As has been described, the approach herein provides a way to self-calibrate an analog signal between the source of the signal and the receiving digital processing circuitry with insignificant additional power and no additional analog noise. The approach serves to reduce the cost and complexity of the receiving circuitry, both analog and digital, by providing a calibrated analog signal and the digital control signals that reduce the A/D requirements, processing bandwidth, and power consumption of the receiving circuitry.

The technique herein automatically calibrates an analog signal such that the gain of the analog signal is within a specified operating range of analog-to-digital conversion and amplification circuitry. In the described approach, the gain during a specific period of time in the life of an analog signal (namely, the train or re-train mode) is determined, and that determined gain is preserved for the remainder of the life of an analog signal (namely, during the data transfer mode). The gain need not be set to a preset value. In a preferred approach, a control function is activated by a sensing function when a summing voltage of the gain of a signal strength is below a low interval of a minimum voltage threshold or above a high interval of a maximum voltage threshold. The control function is stopped when the summing voltage is between a high interval of a minimum voltage threshold and a low interval of a maximum voltage threshold.

The technique described provides a solution to the problem of inadequate analog signal strength at the receiver due to distance from source, environmental impact on the transmitting source, environmental impact on the physical wire condition, or modifications to the physical wire condition. The approach herein also enables the same receiver circuitry to more efficiently operate with analog signals over a wide range of distances or voltages because the described approach presents the receiver with a calibrated analog signal that is within the operating range of the A/D, thereby requiring less bits, less power, and less cost as compared to prior art techniques.

As has been described, the control mechanism described herein preferably automatically increases the gain of an OPAMP circuit until the output reaches the desired amplitude and holds that gain constant. If there is no input signal, preferably the circuit maximizes the gain and holds it constant until a signal is detected. The circuit further monitors the amplified signal to determine whether a signal is within the designed maximum and minimum operating range, and it performs small gain adjustments as needed to increase or decrease the output when it is outside of the specified range. Preferably, these adjustments occur at activation of the system and remain constant for the life of the connection. Preferably, the circuit continuously monitors the output signal to determine whether further adjustments are needed. The output maximum and minimum range, the rate of adjustments, the magnitude of the adjustments, the frequency of the monitoring or sampling, and the response time due to loss of signal, are adjusted as needed.

For example, the above-described circuit provides the necessary gain (or attenuation) to an ADSL, ADSL2+ or VDSL2 signal to enable the DSLAM and modem to sync and then to remain in-sync by maintaining a stable gain environment as well as recalibrating the gain when the equipment is removed or the operating conditions change beyond a defined threshold. Over longer loops, the signal output from the ADSL2+ or VDSL2 amplification apparatus attenuates again and will reduce the achievable bandwidth between a DSLAM and a remote MODEM. As a further extension, the additional embodiment described incorporates a mode whereby two ADSL2+ or VDSL2 apparatus can be daisy-chained between the DSLAM and the remote MODEM to allow for significantly higher bandwidth over the copper loop. In a preferred embodiment, this is achieved by adjusting the control portion of the amplification circuitry to ensure a smooth link synchronization phase with a higher overall gain than would otherwise be possible with the use of a single ADSL2+ or VDSL2 amplification apparatus. In one implementation scenario, this self-calibration is accomplished with less than one milliwatt of additional power consumption by each amplification apparatus, and further having to analyze the signal with a DSP or microprocessor.

The functionality depicted above may, in an alternative embodiment, be implemented in whole or in part using software, e.g., as a set of program instructions executed by a hardware processor, in firmware, in dedicated hardware chips (e.g., FPGA), or combinations of the above with analog circuitry.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

While portions of the disclosed subject matter have been described in the context of a method or process, as noted the subject disclosure also relates to apparatus for performing the operations herein. This apparatus may be specially constructed for the required purposes, or (as also noted) it may comprise a general-purpose processor selectively activated or reconfigured by a computer program stored in the computer. Such a computer program may be stored in a computer readable storage medium, such as, but is not limited to, any type of disk including an optical disk, a CD-ROM, and a magnetic-optical disk, a read-only memory (ROM), a random access memory (RAM), a magnetic or optical card, or any type of media suitable for storing electronic instructions, and each coupled to a computer system bus.

While given components of the system have been described separately, one of ordinary skill will appreciate that some of the functions may be combined or shared in given circuitry, instructions, program sequences, code portions, and the like.

A "mechanism" as described herein may be electronic circuitry (as depicted in the various figures), with or without software-based program control.

Having described our invention, what we now claim is as follows:

1. A method of adjusting a gain of an analog signal adapted to be transmitted over a twisted pair of telephone lines between a first end, and a second end, wherein signaling between the first end and the second end is in a downstream direction, and wherein signaling between the second end and the first end is in an upstream direction, comprising:

with respect to signaling in the downward direction:
  at a first apparatus at a first location along an analog signal path, and during a train mode of a connection establishment between the first and second ends, determining an amount and type of gain adjustment to be applied to the analog signal at the first location, and applying the gain adjustment so determined at the first location;
  at a second apparatus at a second location along the analog signal path that is closer to the second end than is the first location, the second apparatus being distinct from the first apparatus, and during the train mode, determining an amount and type of gain adjustment to be applied to the analog signal at the second location, wherein the determining at the second apparatus at the second location is not initiated until the gain adjustment is first determined and applied at the first apparatus at the first location; and with respect to signaling in the upward direction:
  at the second apparatus at the second location, and during a train mode of a connection establishment between the second and first ends, determining an amount and type of gain adjustment to be applied to the analog signal at the second location, and applying the gain adjustment so determined at the second location;

at the first apparatus at the first location, and during the train mode of the connection establishment between the second and first ends, determining an amount and type of gain adjustment to be applied to the analog signal at the first location, wherein the determining at the first apparatus at the first location is not initiated until the gain adjustment is determined and applied at the second apparatus at the second location.

2. The method as described in claim 1 wherein the first end is a Digital Subscriber Line Access Multiplexer (DSLAM) associated with a central office.

3. The method as described in claim 1 wherein the second end is a modem associated with customer premises equipment (CPE).

4. The method as described in claim 1 further including filtering the analog signal in the downstream direction at the first location.

5. The method as described in claim 1 further including filtering the analog signal in the upstream direction at the second location.

6. The method as described in claim 1 further including maintaining a gain adjustment at the first location until a next re-train mode is initiated.

7. The method as described in claim 1 further including maintaining a gain adjustment at the second location until a next re-train mode is initiated.

8. A method of adjusting a gain of an analog signal adapted to be transmitted over a twisted pair of telephone lines between a first end, and a second end, wherein signaling between the first end and the second end is in a downstream direction, wherein the first end is a Digital Subscriber Line Access Multiplexer (DSLAM) associated with a central office and the second end is a modem associated with customer premises equipment (CPE), comprising:

with respect to signaling in the downward direction:
  at a first apparatus at a first location along an analog signal path, and during a train mode of a connection establishment between the first and second ends, determining an amount and type of gain adjustment to be applied to the analog signal at the first location, and applying the gain adjustment so determined at the first location;
  at a second apparatus at a second location along the analog signal path that is closer to the second end than is the first location, the second apparatus being distinct from the first apparatus, and during the train mode, determining an amount and type of gain adjustment to be applied to the analog signal at the second location, wherein the determining at the second apparatus at the second location is not initiated until the gain adjustment is first determined and applied at the first apparatus at the first location.

9. The method as described in claim 8 further including filtering the analog signal in the downstream direction at the first location.

10. The method as described in claim 8 further including maintaining a gain adjustment at the first location until a next re-train mode is initiated in the downward direction.

11. A method of adjusting a gain of an analog signal adapted to be transmitted over a twisted pair of telephone lines between a first end, and a second end, wherein signaling between the first end and the second end is in a downstream direction, wherein the first end is a Digital Subscriber Line Access Multiplexer (DSLAM) associated with a central office and the second end is a modem associated with customer premises equipment (CPE), comprising:

with respect to signaling in the upward direction:
  at the second apparatus at a second location, and during a train mode of a connection establishment between the second and first ends, determining an amount and type of gain adjustment to be applied to the analog signal at the second location, and applying the gain adjustment so determined at the second location;
  at a first apparatus at a first location, the second apparatus being distinct from the first apparatus, and during the train mode of the connection establishment between the second and first ends, determining an amount and type of gain adjustment to be applied to the analog signal at the first location, wherein the determining at the first apparatus at the first location is not initiated until the gain adjustment is determined and applied at the second apparatus at the second location.

12. The method as described in claim 11 further including filtering the analog signal in the upstream direction at the second location.

13. The method as described in claim 11 further including maintaining a gain adjustment at the second location until a next re-train mode is initiated.

* * * * *